United States Patent
Myers et al.

(10) Patent No.: US 6,693,239 B2
(45) Date of Patent: Feb. 17, 2004

(54) OVERMOLDED CIRCUIT BOARD WITH UNDERFILLED SURFACE-MOUNT COMPONENT AND METHOD THEREFOR

(75) Inventors: Bruce A. Myers, Kokomo, IN (US); Scott D. Brandenburg, Kokomo, IN (US); Jeenhuei S. Tsai, Carmel, IN (US)

(73) Assignee: Delphi Technologies Inc., Troy, MI (US)

( * ) Notice: Subject to any disclaimer, the term of this patent is extended or adjusted under 35 U.S.C. 154(b) by 76 days.

(21) Appl. No.: 09/948,147

(22) Filed: Sep. 6, 2001

(65) Prior Publication Data

US 2003/0042035 A1 Mar. 6, 2003

(51) Int. Cl.[7] .............................................. H01L 23/28
(52) U.S. Cl. ...................... 174/52.2; 174/52.4; 257/778; 257/787
(58) Field of Search ............................... 174/52.2, 52.3, 174/52.4, 250, 255, 260; 361/760, 764, 820; 257/778, 787

(56) References Cited

U.S. PATENT DOCUMENTS

| | | | | |
|---|---|---|---|---|
| 5,385,869 A | * | 1/1995 | Liu et al. ....................... | 29/841 |
| 5,612,576 A | * | 3/1997 | Wilson et al. ................ | 257/788 |
| 5,710,071 A | * | 1/1998 | Beddingfield et al. ....... | 438/108 |
| 6,490,166 B1 | * | 12/2002 | Ramalingam et al. ....... | 361/760 |
| 6,519,844 B1 | * | 2/2003 | Nagarajan et al. ............ | 29/841 |

* cited by examiner

Primary Examiner—Dean A. Reichard
Assistant Examiner—Carmelo Oliva
(74) Attorney, Agent, or Firm—Jimmy L. Funke; Stefan V. Chmielewski

(57) ABSTRACT

An overmolded circuit board assembly and a method for forming the assembly. The assembly and method entail overmolding both surfaces of a circuit board and underfilling at least one surface-mount circuit device attached to at least one surface of the board with solder bump connections, with the result that the circuit device is spaced above the surface of the circuit board so as to define a gap therebetween. A cavity, such as a blind hole or closed through-hole, is defined in the surface of the circuit board beneath the circuit device and communicates with the gap but is closed off from the opposite surface of the circuit board. Air that is trapped in the gap by a molding material during the overmolding/underfilling process is collected and compressed within the cavity, yielding a void-free underfill between the circuit board and circuit device.

34 Claims, 3 Drawing Sheets

OVERMOLDED CIRCUIT BOARD WITH UNDERFILLED SURFACE-MOUNT COMPONENT AND METHOD THEREFOR

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to overmolded circuit boards with surface-mount (SM) devices, such as flip chips. More particularly, this invention relates to an overmolded circuit board and process by which the circuit board is overmolded and a surface-mount device on the circuit board is simultaneously underfilled with the overmold material, without the creation of voids between the device and circuit board.

(2) Description of the Related Art

Circuit boards with semiconductor devices such as flip chips must often be protected from the environment in which the board is employed. One widely-practiced approach is to enclose a circuit board in an assembly composed of a pair of case halves that are secured together with fasteners to form an enclosure. Because this assembly process is labor intensive, less complicated assembly processes have been sought. One solution is an overmolded assembly disclosed in commonly-assigned U.S. Pat. No. 6,180,045 to Brandenburg et al. This assembly includes a circuit board, a heatsink with pedestals that thermally contact one or more circuit components mounted to the circuit board, and an optional retainer that biases the components into contact with the heatsink pedestals. An overmolded body encases the circuit board and retainer such that, with the heatsink, the overmolded body forms a protective environmental seal around the circuit board and its circuit components.

Underfilling is well known for promoting the reliability of flip chips and ball grid array (BGA) packages attached to organic circuit boards with numerous solder bumps connections, which result in a gap being present between the component and circuit board. Filling this gap, also termed the "stand-off" height of the device, with an appropriate material has been shown to greatly improve the thermal cycle life of the solder connections. However, for optimum reliability underfilling must completely fill the gap, and therefore has typically required the use of a low-viscosity underfill material, such as a specially-formulated thermosetting epoxy. In a conventional underfill process, the underfill material is placed at the perimeter of the component so that capillary action draws the material beneath the component. To avoid the entrapment of air that would form voids in the underfill material beneath the component, the underfill material is typically placed along only one or two sides of the component, such that as the underfill material flows through the component-to-circuit board gap, air is pushed out ahead of the underfill material.

A second underfill method known in the industry is primarily used for packaged flip chips, such as BGA packages, and combines the overmolding and underfilling operations. However, this method has conventionally been limited to overmolding only one side of a circuit board. The circuit board is placed in a mold that defines a sufficiently restrictive gap between the component and mold surface, so that as the molding material is injected at one end of the mold cavity, the molding material is forced into the gap between the component and circuit board at a rate that prevents air from being entrapped in the gap. Difficulties arise when attempting to overmold both surfaces of a circuit board and simultaneously underfill devices on the board. As represented in FIG. 1, with finer solder bump pitches (corresponding to a low stand-off height) there is a greater propensity for a large underfill void 110 to form between a chip 114 and its circuit board 112 during the overmold process. FIG. 1 shows the result of a molding material 116 flowing faster through larger openings in the mold cavity (e.g., the gap between the chip 114 and the upper mold 118) than through the smaller (e.g., 0.003 inch (about 75 micrometers)) gap between the chip 114 and board 112. Once the entire periphery of the chip 114 is covered with the molding material 116 from above, air is trapped beneath the chip 114 to produce the void 110.

A common method to reduce void formation in various molding operations is to use one or more vent holes to avoid air entrapment. However, as represented in FIG. 2, when an attempt was made to apply the use of a vent 120 to a circuit board assembly of the type shown in FIG. 1, the result was not the elimination of voids, but only the shifting of the void 110 to another region beneath the chip 114. The cause of this shift was that each chip 114 impedes the flow of underfill material 116, resulting in uneven flow of underfill material 116 through the cavities on opposite sides of the circuit board 112. Underfill material 116 entered the gap between the lower chip 114 and the circuit board 112 before all of the air was purged from the gap, entrapping air between the vent 120 and the edge of the chip 114 facing the flow of material 116. Accordingly, the vent 120 did not enable complete underfilling of the chips 114 on the circuit board 112 while simultaneously overmolding both surfaces of the board 112.

BRIEF SUMMARY OF THE INVENTION

According to the present invention, there is provided an overmolded circuit board assembly and a method for forming the assembly. The assembly and method entail overmolding both surfaces of a circuit board and underfilling one or more surface-mount circuit devices attached to at least a first surface of the board with solder bump connections, with the result that the circuit device is spaced above the first surface of the circuit board by the solder bump connections so as to define a gap therebetween. The invention entails the use of a cavity or pocket defined in the first surface of the circuit board beneath the circuit device, such that the cavity communicates with the gap between the circuit board and the circuit device, but is closed off from the surface of the circuit board opposite the device. As a result of the presence of the cavity, gas (e.g., air) that is trapped in the gap by a molding material and would otherwise form a void beneath the device is compressed within the cavity as the molding material completely fills the gap between the circuit board and the circuit device and encapsulates the circuit device and both surfaces of the circuit board.

From the above, it can be seen that the present invention enables air trapped under a circuit device (e.g., a flip chip) during a simultaneous overmolding and underfilling process to escape to a non-critical area in or under the circuit board. More particularly, the trapped air is forced into the cavity in the circuit board surface so as not to contact the flip chip.

Since circuit boards are typically much thicker than the gap between the board and devices mounted to the board, the cavity can be much smaller in diameter than the diameter of a void that would be formed by the trapped air that the cavity is intended to accommodate. As such, a single cavity can often be sized to completely eliminate voids beneath an underfilled flip chip.

The ability to eliminate underfill voids with this invention serves to significantly improve the reliability of the solder connections that attach flip chips or other SM circuit devices when subjected to moisture and thermal cycling. This benefit of the invention is achieved while simultaneously overmolding the entire circuit board assembly to produce a protective environmental seal, and with the use of existing materials with little or no changes in the manufacturing process.

Other objects and advantages of this invention will be better appreciated from the following detailed description.

DETAILED DESCRIPTION OF THE INVENTION

Figure 3:
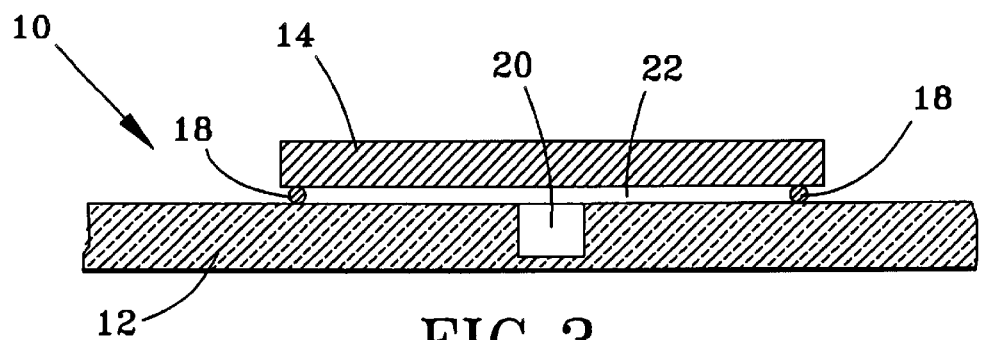
FIGS. 3 and 4 represent a circuit board assembly before and after, respectively, a molding operation during which the assembly was overmolded and the flip chip was simultaneously underfilled in accordance with a first embodiment of this invention.
Figure 4:
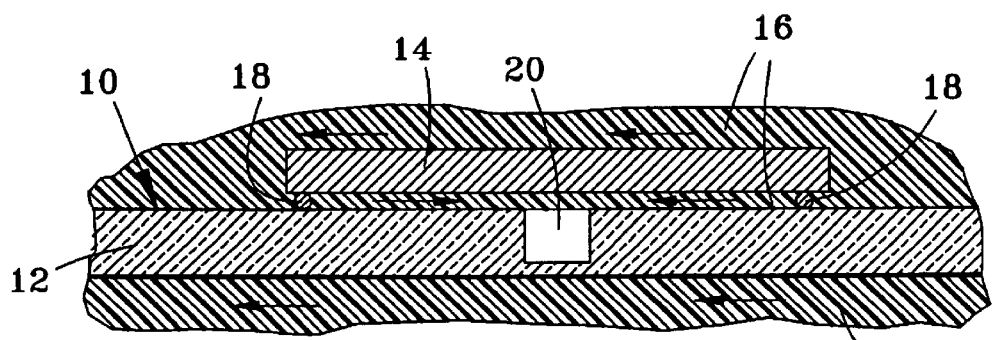

FIGS. 3 and 4 represent a circuit board assembly 10 before and after overmolding, respectively, in accordance with a first embodiment of this invention. The assembly 10 is shown as comprising a circuit board 12 having a surface to which a flip chip 14 is attached with solder connections 18, which are typically located along the entire perimeter of the chip 14. The circuit board 12 may be a laminate, printed wiring board (PWB), or any other suitable circuit board material known in the art. While a flip chip 14 is represented in FIGS. 3 and 4, the invention is applicable to essentially any surface-mount device, including BGA's, that is physically and electrically connected to a circuit board with solder connections formed by any suitable method, such as a solder bump reflow technique.

FIGS. 3 and 4 also show a cavity 20 centrally located in the surface of the circuit board 12 beneath the flip chip 14. The cavity 20 is shown as being a blind hole beneath the chip 14, and serves to receive air trapped beneath the chip 14 during an underfill process, as depicted in FIG. 4. More particularly, the cavity 20 is intended to accommodate air (or whatever gas may be present) during a molding process in which the chip 14 is underfilled while the circuit board 12 is simultaneously overmolded with the same molding material 16. The molding material 16 encases the circuit board 12 and chip 14, filling the gaps between the circuit board 12 and upper and lower molds (not shown) in which the molding operation is performed. The result is an overmolded housing 30 that forms a protective environmental seal around the circuit board 12 and chip 14.

An object of the invention is that the molding material 16 not only fills the mold cavities on either side of the board 12, but also completely fills a gap 22 between the chip 14 and the board 12 created as a result of the solder connections 18 spacing the chip 14 above the surface of the board 12. To perform this dual role, the molding material 16 must readily flow during the overmolding/underfilling operation, and after curing have a suitable CTE relative to that of the board 12. Appropriate materials are thermosetting polymers such as epoxies to which a fine particulate fill material is added to achieve a CTE of about 12 to 17 ppm/° C. The fill material preferably has an average particle size of less than 1.0 mil (25 micrometers) to be sufficiently flowable during molding. Suitable compositions for the fill material are dependent on the particular thermosetting polymer used and the amount necessary to achieve the desired CTE. Particularly suitable overmold/underfill materials for the molding material 16 are thermoset epoxy resins to which about 80 to about 90 volume percent of silicon particles is admixed as a fill material.

The flow of the molding material 16 during the molding operation is indicated by arrows in FIG. 4. The molding material 16 is indicated as being injected into the mold cavity from the right-hand side of FIG. 4, such that the molding material 16 flow is leftward across the top of the chip 14 and simultaneously between adjacent solder connections 18 along the near edge (the right edge in FIG. 4) of the chip 14. However, because of the restricted space between solder connections 18 and the narrowness of the gap 22 between the chip 14 and circuit board 12, the molding material 16 will advance leftward much more rapidly over and around the chip 14 than through the gap 22. As the molding material 16 covers the edges of the chip 14 oriented parallel to the flow direction, the molding material 16 enters the gap 22 and flows toward the center of the chip 14. Once the molding material 16 reaches the far (left) edge of the chip 14, air is entrapped beneath the chip 14 as the material 16 begins to flow in a rightward direction through the gap 22. In practice, the opposing fronts of molding material 16 within the gap 22 will arrive at the cavity 20 almost simultaneously as a result of the narrowness of the gap 22 and the pressure buildup of the entrapped air. The intent of the invention is that, at the conclusion of the molding operation, all of the entrapped air will be contained within the cavity 20, as shown in FIG. 4. In this manner, the cavity 20 isolates the entrapped air in a non-critical area of the circuit board 12, in that the air trapped within the cavity 20 does not contact the lower surface of the chip 14 and therefore does not have a detrimental effect on the thermal cycle life of the chip 14.

The board 12 is much thicker than the gap 22 between the flip chip 14 and the board 12, such that the cavity 20 can accommodate an amount of air that would otherwise form a void with a much larger diameter than the cavity 20. For example, assuming sufficient trapped air to form a 0.1 inch (about 2.5 mm) diameter void in a 0.003 inch (about 75 micrometers) gap 22, and a circuit board 12 with a sufficient thickness (e.g., about 1.2 mm) to allow for a cavity 20 of about 0.035 inch (about 0.89 mm) in depth, the diameter of the cavity 20 required to accommodate the air without any compression would be only about 0.029 inch (about 0.74 mm). A cavity 20 of this size would not affect the thermal cycle reliability of the flip chip 14, based on experience with production flip chip designs that employ through-hole vias under the chip for interconnect and thermal dissipation functions.

Figure 5:
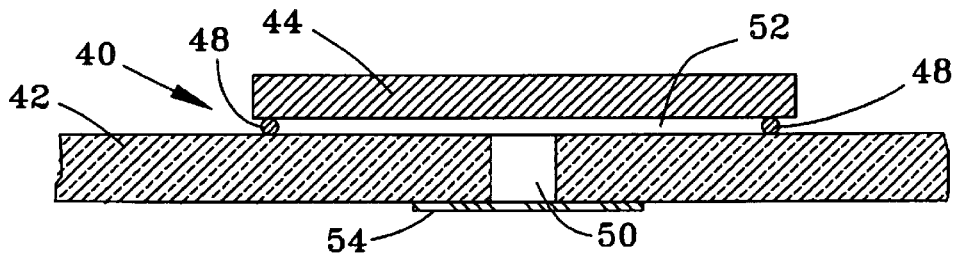
FIGS. 5, 6 and 7 represent circuit board assemblies in accordance with second, third and fourth embodiments of this invention.
Figure 6:
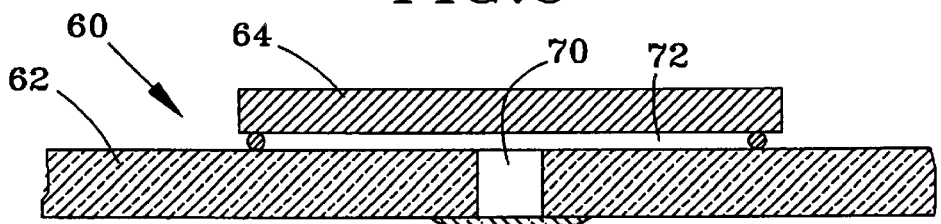
Figure 7:
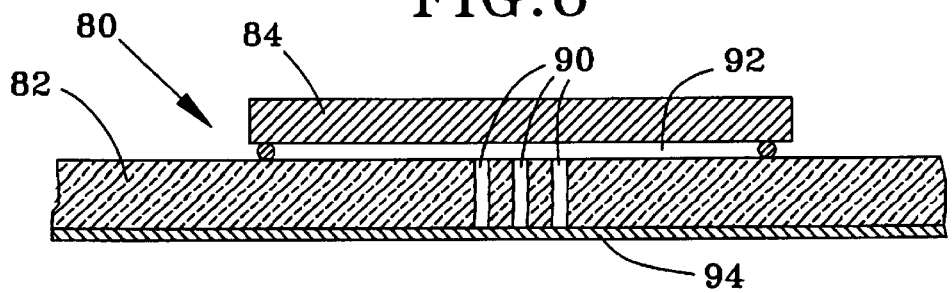

While the cavity 20 could be formed as a blind hole in the circuit board 12 by drilling or another suitable technique, the cost of doing so would be prohibitive for use in mass production. FIGS. 5 through 7 represent three lower-cost approaches for forming a closed hole in a circuit board. FIGS. 5 and 6 make use of a single closed hole, while FIG. 7 represents an embodiment in which multiple closed holes are used. In FIG. 5, a circuit board assembly 40 is shown as comprising a flip chip 44 attached with solder connections 48 to a circuit board 42, essentially in an identical manner to that of FIGS. 3 and 4. A cavity 50 is formed by closing a through-hole in the circuit board 42 with an adhesive tape 54 applied to the surface of the board 42 opposite the chip 44. Suitable tape materials for use in this embodiment include pressure-sensitive adhesive (PSA) tapes comprising acrylic adhesives on a polyimide film.

In FIG. 6, a circuit board assembly 60 is shown in which a cavity 70 is formed by closing a through-hole in a circuit board 62 with an adhesive compound 74 applied to the surface of the board 62 opposite a chip 64. A suitable compound 74 for this embodiment is an RTV or heat-curable silicone adhesive, an example of which is commercially available from Shin Etsu under the name X-832-161A. The adhesive compound 74 can be applied in any suitable manner prior to the overmolding/underfilling process.

FIG. 7 shows a circuit board assembly 80 in which multiple cavities 90 are formed by closing through-holes in a circuit board 82 with a solder mask 94 applied to the surface of the board 82 opposite a flip chip 84. As such, the through-holes of FIG. 7 can be sealed during typical circuit board manufacture, and with essentially any printed or film solder mask material. Since solder mask materials typically have relatively low mechanical strength as compared to an adhesive tape or compound, FIG. 7 represents the cavities 90 as having relatively small diameters to prevent rupturing by trapped compressed air during the molding operation. Hence, multiple cavities 90 are required to accommodate a volume of air comparable to that which can be accommodated by the larger cavities 50 and 70 of FIGS. 5 and 6.

In an investigation leading to this invention, 0.400 inch (about 1 mm) and 0.200 inch (about 0.5 mm) flip chips were mounted to a 0.047 inch (about 1.2 mm) thick circuit board in which cavities were formed by closing 0.015 and 0.030 inch (about 0.38 and 0.76 mm) diameter through-holes in the board with a PSA tape commercially available from 3M under the name KAPTON®. This PSA tape has an acrylic adhesive on a 0.003 inch (about 75 micrometers) thick polyimide backing. The chip was reflow soldered to the board in accordance with conventional practice to yield fine-pitch solder connections spaced about 0.008 inch (about 0.2 mm) apart, with a stand-off height (gap 52 in FIG. 5) of about 0.003 inch (about 75 micrometers). In a molding process similar to that represented in FIG. 4, the board and chip were simultaneously overmolded and underfilled, respectively, using a thermoset epoxy resin available from Plaskon under the name 200-302B, but then modified by the addition of about 80 to 90 volume percent of a silicon powder having an average particle size of less than 10 micrometers to achieve a viscosity of about 35 poise. Examination of the chip following the molding operation revealed that voids were not present anywhere in the underfill. As such, the use of a tape 54 to close a through-hole as represented in FIG. 5 was shown to be successful. During the same investigation, additional chips were attached to circuit boards under the same conditions, except multiple through-holes were closed with a solder mask in the manner shown in FIG. 7. This technique was also determined to eliminate voids beneath the chips.

Figure 1:
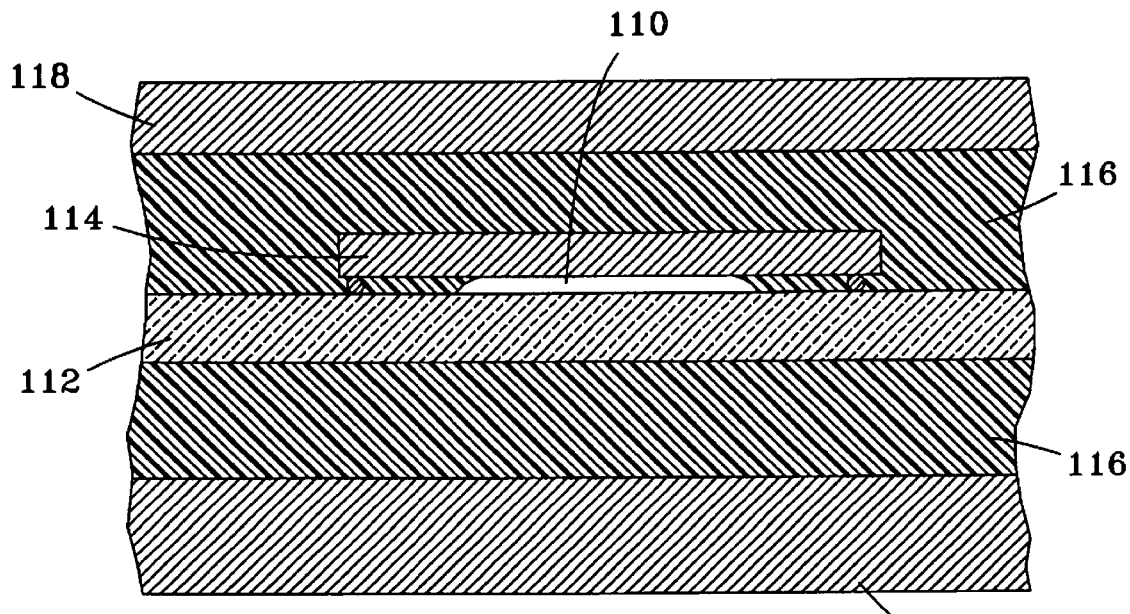
FIG. 1 represents a void in an underfill beneath a flip chip on a circuit board assembly following a molding operation during which the assembly was overmolded and the flip chip was simultaneously underfilled in accordance with the prior art.
Figure 2:
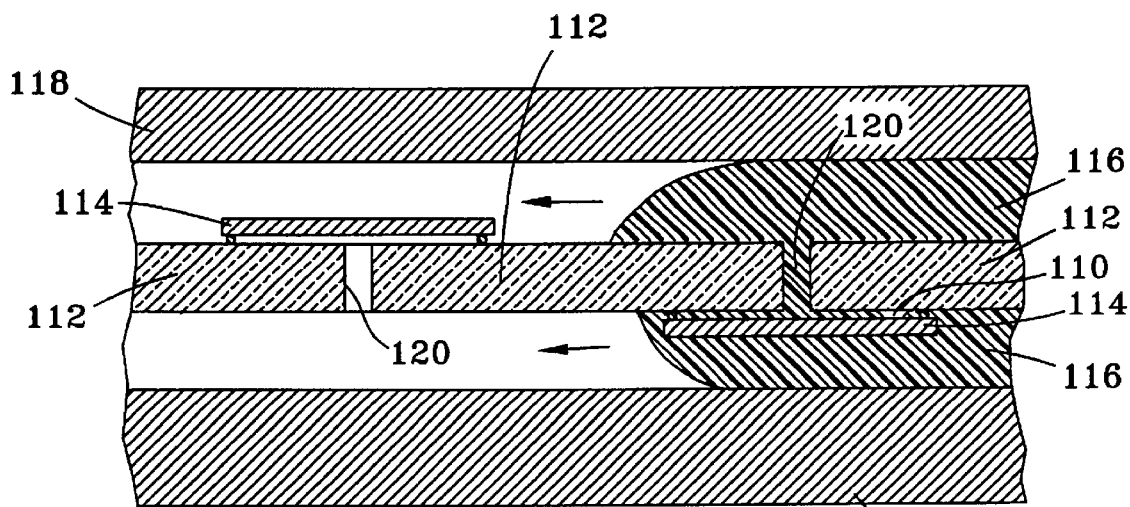
FIG. 2 represents an unsuccessful attempt to use a vent to eliminate voids beneath flip chips that were underfilled while the circuit board to which they were attached was simultaneously overmolded.
Figure 8:
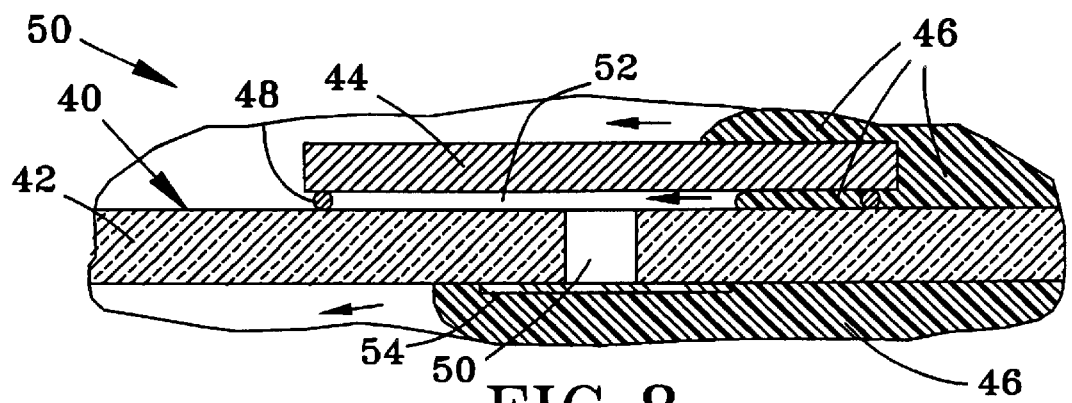
FIGS. 8 and 9 represent alternative molding operations performed on a modified circuit board assembly of FIG. 5.
Figure 9:
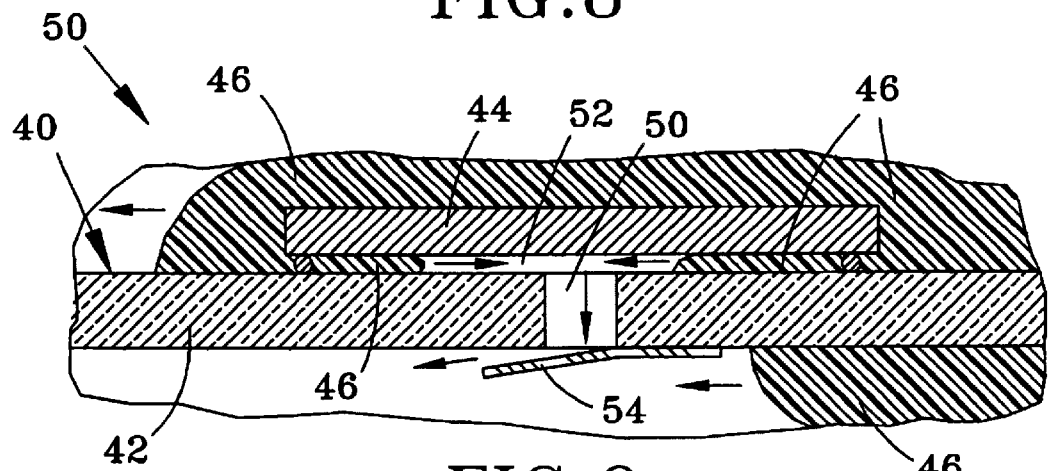

FIGS. 8 and 9 illustrate additional features made possible with the embodiment represented in FIG. 5. As represented in FIG. 8, the adhesive tape 54 is pressed tightly against the circuit board 42 because the pressure is higher on the lower side of the board 42 as a result of the molding material 46 having a more advanced front along the lower surface of the board 42 as compared to the upper surface of the board 42. Such a situation can be expected because of the resistance to flow provided by a combination of the chip 44, the gap size, the number and size of other components on the board 42, and the mold gating. However, under molding conditions in which a higher pressure is present at the upper surface of the board 42, air entrapped in the gap 52 beneath the chip 44 causes one side of the tape 54 to be pushed away from the board 42, allowing the entrapped air to be vented through the cavity 50 to the lower side of the circuit board 42. In this manner, the tape 54 behaves as a check valve or one-way valve that allows air to escape from under the chip 44, but does not allow the molding material 46 to flow up through the cavity 50 to entrap air beneath the chip 44, which is the undesired result of the molding operation represented in FIG. 2.

Figure 10:
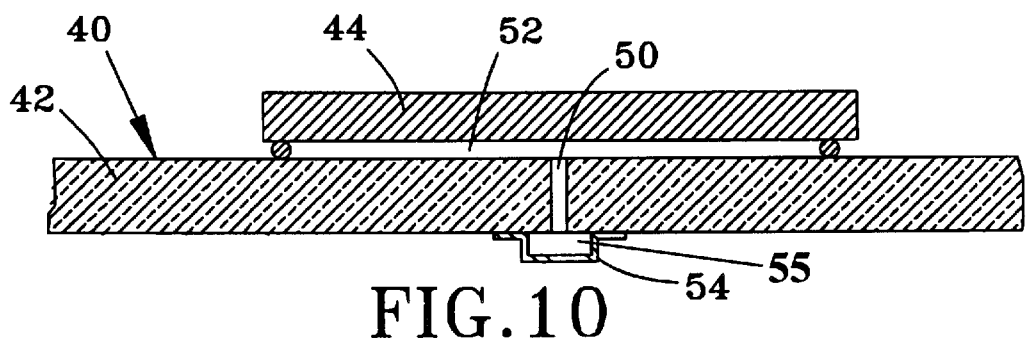
FIGS. 10 and 11 represent circuit board assemblies in accordance with additional embodiments of this invention.
Figure 11:
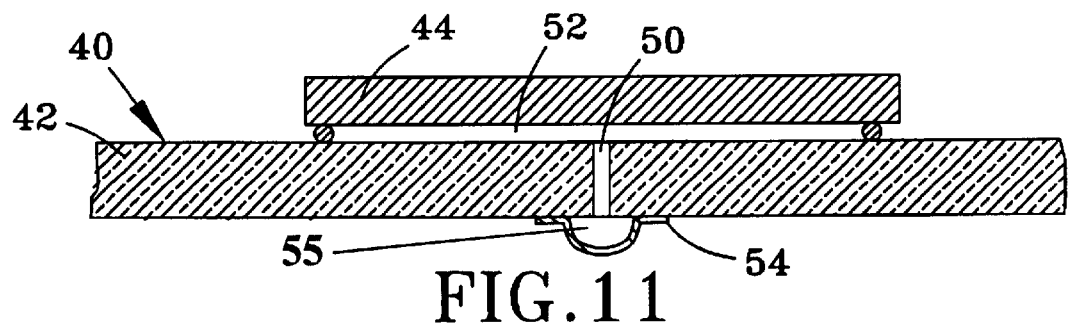

FIGS. 10 and 11 represent two additional embodiments of this invention that allow for more air volume to be accommodated in a through-hole closed by a tape. In FIG. 10, the tape 54 of FIG. 5 has been modified to define a pocket 55 below the through-hole, thereby increasing the volume of the cavity 50. This embodiment is believed to benefit from the use of a more rigid tape 54 capable of maintaining the shape of the pocket 55. As an example, an acrylic adhesive on a thin metal (e.g., aluminum) film could be used as the tape 54. FIG. 11 shows the tape 54 as being formed to have a sufficiently elastic backing material to allow the tape 54 to expand to accommodate a larger air volume. An advantage of each of these embodiments is to allow the use of a smaller diameter cavity 50 in the circuit board 42 to accommodate a given volume of air.

While our invention has been described in terms of particular embodiments, it is apparent that other forms could be adopted by one skilled in the art. For example, the overmolding of a variety of surface-mount circuit devices, such as BGA packages, would benefit from this invention. Accordingly, the scope of our invention is to be limited only by the following claims.

What is claimed is:

1. An over-molded circuit board assembly comprising:

a circuit board having a first surface and an oppositely-disposed second surface;

a surface-mount circuit device attached to the first surface of the circuit board with solder bump connections, the circuit device being spaced above the first surface of the circuit board by the solder bump connections so as to define a gap therebetween; and at least one cavity defined in the circuit board beneath the circuit device, each of the at least one cavity communicating with the gap between the circuit board and the circuit device and being closed off from the second surface of the circuit board; and a molding material that completely fills the gap between the circuit board and the circuit device and encapsulates the circuit device and the circuit board at the first and second surfaces thereof, wherein the at least one cavity contains pressurized gas.

2. An overmolded circuit board assembly according to claim 1, wherein the at least one cavity consists of a single cavity defined in the circuit board beneath the circuit device.

3. An overmolded circuit board assembly according to claim 1, wherein the at least one cavity is defined by a blind hole in the first surface of the circuit board.

4. An overmolded circuit board assembly according to claim 1, wherein the at least one cavity is defined by a through-hole in the circuit board that is closed with a material applied to the second surface of the circuit board.

5. An overmolded circuit board assembly according to claim 4, wherein the material is an adhesive tape applied to the second surface of the circuit board.

6. An overmolded circuit board assembly according to claim 5, wherein the adhesive tape is bonded to the second surface of the circuit board so that a portion of the adhesive tape is deflectable from the second surface to enable venting of air from the first surface of the circuit board to the second surface thereof.

7. An overmolded circuit board assembly according to claim 5, wherein the adhesive tape comprises a pocket or is deformable to define a pocket that increases the volume of the at least one cavity.

8. An overmolded circuit board assembly according to claim 4, wherein the material is an adhesive compound applied to the second surface of the circuit board.

9. An overmolded circuit board assembly according to claim 4, wherein the material is a solder mask layer applied to the second surface of the circuit board.

10. An overmolded circuit board assembly according to claim 1, wherein there are a plurality of cavities in the first surface of the circuit board, each of the cavities communicating with the gap between the circuit board and the circuit device.

11. An overmolded circuit board assembly comprising:
   a circuit board having a first surface and an oppositely-disposed second surface;
   a surface-mount circuit device attached to the first surface of the circuit board with solder bump connections, the circuit device being spaced above the first surface of the circuit board by the solder bump connections so as to define a gap therebetween;
   at least one cavity in the circuit board beneath the circuit device, each of the at least one cavity being defined by a via extending completely through the circuit board;
   means for closing each of the at least one cavity at the second surface of the circuit board such that each of the at least one cavity communicates with the gap between the circuit board and the circuit device; and
   a molding material encasing the first and second surfaces of the circuit board and the circuit device to provide a protective seat around the circuit board and the circuit device, the molding material also completely filling the gap between the circuit device and the circuit board so as to underfill the circuit device and encapsulate the solder bump connections, the molding material compressing a gas within the at least one cavity.

12. An overmolded circuit board assembly according to claim 11, wherein the closing means is an adhesive tape applied to the second surface of the circuit board.

13. An overmolded circuit board assembly according to claim 12, wherein the adhesive tape is bonded to the second surface of the circuit board so that a portion of the adhesive tape is deflectable from the second surface to enable venting of the gas from the first surface of the circuit board to the second surface thereof.

14. An overmolded circuit board assembly according to claim 12, wherein the adhesive tape comprises a pocket or is deformable to define a pocket that increases the volume of the at least one cavity.

15. An overmolded circuit board assembly according to claim 11, wherein the closing means is an adhesive compound applied to the second surface of the circuit board.

16. An overmolded circuit board assembly according to claim 11, wherein the closing means is a solder mask layer applied to the second surface of the circuit board.

17. An overmolded circuit board assembly according to claim 16, wherein the at least one cavity comprises at least a second cavity in the first surface of the circuit board, the second cavity communicating with the gap between the circuit board and the circuit device.

18. A method of forming an overmolded circuit board assembly, the method comprising the steps of:
   providing a circuit board having a first surface, an oppositely-disposed second surface, and at least one cavity defined in the circuit board, the at least one cavity communicating with the first surface of the circuit board and being closed off from the second surface of the circuit board;
   mounting a surface-mount circuit device with solder bump connections to the first surface of the circuit board so that the at least one cavity is beneath the circuit device, the circuit device being spaced above the first surface of the circuit board by the solder bump connections so as to define a gap therebetween that communicates with the at least one cavity; and
   encapsulating the circuit device and the circuit board at the first and second surfaces thereof with a molding material, and completely filling the gap between the circuit board and the circuit device with the molding material, the molding material flowing in the gap so as to compress a gas within the at least one cavity.

19. A method according to claim 18, wherein the at least one cavity provided in the circuit board consists of a single cavity.

20. A method according to claim 18, wherein the at least one cavity is defined by forming at least one blind hole in the first surface of the circuit board.

21. A method according to claim 18, wherein the at least one cavity is defined by forming at least one through-hole in the circuit board, and then closing the at least one through-hole with a material applied to the second surface of the circuit board.

22. A method according to claim 21, wherein the material is an adhesive tape applied to the second surface of the circuit board.

23. A method according to claim 22, wherein the adhesive tape is bonded to the second surface of the circuit board so that a portion of the adhesive tape is deflectable from the second surface, and the adhesive tape deflects as the molding material fills the gap between the circuit board and the circuit device to enable venting of a gas from the first surface of the circuit board to the second surface thereof.

24. A method according to claim 22, wherein the adhesive tape comprises a pocket that increases the volume of the at least one cavity or is deformable to define a pocket as the molding material fills the gap between the circuit board and the circuit device to increase the volume of the at least one cavity as gas is forced under pressure into the at least one cavity.

25. A method according to claim 21, wherein the material is an adhesive compound applied to the second surface of the circuit board.

26. A method according to claim 21, wherein the material is a solder mask layer applied to the second surface of the circuit board.

27. A method according to claim 18, wherein there are a plurality of cavities in the first surface of the circuit board, each of the plurality of cavities communicating with the gap between the circuit board and the circuit device.

28. A method of forming an overmolded circuit board assembly comprising a circuit board having a first surface and an oppositely-disposed second surface, a surface-mount circuit device attached to the first surface of the circuit board with solder bump connections, and at least one through-hole in the circuit board beneath the circuit device, the circuit device being spaced above the first surface of the circuit board by the solder bump connections so as to define a gap therebetween in communication with the at least one through-hole, the method comprising the steps of:

closing the at least one through-hole at the second surface of the circuit board to form at least one cavity that communicates with the gap between the circuit board and the circuit device; and then encasing the circuit board and the circuit device in a molding material to provide a protective seal around the first and second surfaces of the circuit board and the circuit device, the molding material being injected around the circuit board and filling the gap between the circuit device and the circuit board so as to underfill the circuit device, encapsulate the solder bump connections, and compress a gas within the at least one cavity.

29. A method according to claim 28, wherein the closing step is performed by applying an adhesive tape to the second surface of the circuit board.

30. A method according to claim 29, wherein the adhesive tape is bonded to the second surface of the circuit board so that a portion of the adhesive tape is deflectable from the second surface, and the adhesive tape deflects as the molding material fills the gap between the circuit board and the circuit device to enable venting of the gas from the first surface of the circuit board to the second surface thereof.

31. A method according to claim 29, wherein the adhesive tape comprises a pocket that increases the volume of the at least one cavity or is deformable to define a pocket as the molding material fills the gap between the circuit board and the circuit device to increase the volume of the at least one cavity as gas is forced under pressure into the at least one cavity.

32. A method according to claim 28, wherein the closing step is performed by applying an adhesive compound to the second surface of the circuit board.

33. A method according to claim 28, wherein the closing step is performed by applying a solder mask layer to the second surface of the circuit board.

34. A method according to claim 33, further comprising further comprising the step of forming at least a second cavity in the first surface of the circuit board, the second cavity communicating with the gap between the circuit board and the circuit device.

* * * * *